United States Patent
Hwang et al.

(10) Patent No.: US 10,325,654 B2
(45) Date of Patent: Jun. 18, 2019

(54) RESISTIVE MEMORY DEVICE AND METHOD OF FABRICATING THE SAME

(71) Applicants: SK hynix Inc., Icheon (KR); Seoul National University R&DB Foundation, Seoul (KR)

(72) Inventors: Cheol Seong Hwang, Seoul (KR); Jaeyeon Lee, Seoul (KR)

(73) Assignees: Seoul National University R&DB Foundation, Seoul (KR); SK hynix Inc., Icheon (KR)

(*) Notice: Subject to any disclaimer, the term of this patent is extended or adjusted under 35 U.S.C. 154(b) by 0 days.

(21) Appl. No.: 15/859,165

(22) Filed: Dec. 29, 2017

(65) Prior Publication Data
US 2018/0190352 A1 Jul. 5, 2018

(30) Foreign Application Priority Data
Dec. 31, 2016 (KR) .................. 10-2016-0184598

(51) Int. Cl.
| G11C 11/00 | (2006.01) |
| G11C 13/00 | (2006.01) |
| H01C 17/00 | (2006.01) |
| H01C 17/065 | (2006.01) |
| H01C 17/08 | (2006.01) |

(52) U.S. Cl.
CPC ........ *G11C 13/0011* (2013.01); *H01C 17/006* (2013.01); *H01C 17/06553* (2013.01); *H01C 17/08* (2013.01)

(58) Field of Classification Search
CPC .............. G11C 13/0011; H01C 17/006; H01C 17/06553; H01C 17/08
USPC ..................... 365/148, 46, 94, 100, 129
See application file for complete search history.

(56) References Cited

U.S. PATENT DOCUMENTS

| 8,179,713 B2* | 5/2012 | Kanzawa | G11C 11/5685 365/148 |
| 8,279,657 B2* | 10/2012 | Takagi | G11C 13/0007 365/148 |
| 8,553,446 B2* | 10/2013 | Mitani | G11C 13/0007 365/100 |
| 2008/0278988 A1* | 11/2008 | Ufert | G11C 11/04 365/148 |

(Continued)

FOREIGN PATENT DOCUMENTS

KR  10-2013-0052371 A  5/2013

*Primary Examiner* — Harry W Byrne

(57) ABSTRACT

A resistive memory device and a fabricating method thereof are provided. The resistive memory device includes: a first electrode electrically coupled with a first wire; a second electrode facing the first electrode and electrically coupled with a second wire, the second electrode including an oxygen vacancy reservoir and a contact electrode, and a memory cell including a variable resistive layer and being disposed between the first electrode and the second electrode. The variable resistive layer has a conductive filament, which includes oxygen vacancies and connects the first electrode and the second electrode. The oxygen vacancy reservoir is disposed on the variable resistive layer, and the contact electrode is coupled to the oxygen vacancy reservoir and the second wire. The oxygen vacancy reservoir has a volume or oxidizing power to exchange a limited amount of oxygen ions and oxygen vacancies required for switching the conductive filament with the variable resistive layer.

9 Claims, 12 Drawing Sheets

(56) References Cited

U.S. PATENT DOCUMENTS

| | | | |
|---|---|---|---|
| 2010/0232204 A1* | 9/2010 | Muraoka | G11C 13/0007 |
| | | | 365/148 |
| 2011/0103131 A1* | 5/2011 | Katayama | G11C 13/0007 |
| | | | 365/148 |
| 2011/0317470 A1* | 12/2011 | Lu | G11C 13/0007 |
| | | | 365/148 |
| 2012/0176834 A1* | 7/2012 | Ikeda | H01L 27/0688 |
| | | | 365/148 |
| 2012/0236628 A1* | 9/2012 | Ikeda | G11C 13/0007 |
| | | | 365/148 |
| 2012/0275211 A1* | 11/2012 | Yi | G11C 13/0007 |
| | | | 365/148 |
| 2013/0121060 A1* | 5/2013 | Lee | G11C 11/5685 |
| | | | 365/148 |
| 2014/0112055 A1* | 4/2014 | Kawahara | G11C 13/00 |
| | | | 365/148 |
| 2014/0321197 A1* | 10/2014 | Ninomiya | G11C 13/0069 |
| | | | 365/148 |
| 2015/0103583 A1* | 4/2015 | Tada | G11C 13/0002 |
| | | | 365/148 |
| 2016/0197271 A1 | 7/2016 | Gassilloud et al. | |

* cited by examiner

RESISTIVE MEMORY DEVICE AND METHOD OF FABRICATING THE SAME

CROSS-REFERENCES TO RELATED APPLICATION

The present application claims priority under 35 U. S. C. 119(a) to Korean Patent Application Number 10-2016-0184598, filed on Dec. 31, 2016, which is herein incorporated by reference in its entirety.

BACKGROUND

1. Field of the Invention

The present examples relate to a semiconductor memory device, and more particularly, to a resistive memory device which is a nonvolatile memory device and a method of fabricating the same.

2. Description of the Related Art

Recently, as demand for portable digital applications such as digital cameras, tablet computers and smart phones has increased remarkably, the non-volatile memory market has been rapidly expanded.

A NAND flash memory device, which is a representative programmable non-volatile memory device, improves storage capacity through multi-level implementation and/or three-dimensional cell structure, but since the fabricating process of the NAND flash memory device becomes more difficult and the fundamental limitations of the NAND flash memory device with long drive time due to a block access architecture and tunneling process, the need for the memory devices having high speed and low power cannot be met sufficiently with the NAND flash memory.

As a new nonvolatile memory device that is an alternative to a NAND flash memory device, a resistive memory device (ReRAM) using a variable resistor having a reversible resistance value is being actively researched and developed. The resistive memory device may use the physical characteristics of the reversibly switchable low resistance state (LRS) and high resistance state (HRS) of the variable resistor as data states and, thereby implementing fast switching of less than 10 ns, low power consuming operation at 1 pJ/operation and it is advantageous in terms of scaling down by virtue of its simple structure.

However, in spite of these advantages, the resistive memory element has shortcomings that reversibility of the conductive filament or the conductive bridge deteriorates due to repeated switching cycles. As a result, the memory cell has a performance deviation between switching cycles or has demerits such as breakdown and shortened life due to deterioration of durability.

SUMMARY

An object of the present disclosure is to improve durability of set and reset operations using a switching mechanism of a resistive memory device, and is to provide a resistive memory device, wherein uniformity between switching cycles, reliability and durability of switching mechanism are improved by securing an structure or material having an excellent reversibility of resistive switching of a resistive memory device, and thereby has an excellent data retention performance and long life cycle.

Further, another object of the present disclosure is to provide a method of fabricating a resistive memory device having the above-described advantages.

According to an aspect of the present disclosure, there is provided a resistive memory device including a first electrode electrically coupled with a first wire; a second electrode facing the first electrode and electrically coupled with a second wire, the second electrode including a finite oxygen vacancy reservoir and a contact electrode, and a memory cell including a variable resistive layer and being disposed between the first electrode and the second electrode, the variable resistive layer having a conductive filament that includes one or more oxygen vacancies and that connects the first electrode and the second electrode. The finite oxygen vacancy reservoir may be disposed on the variable resistive layer, and the contact electrode may be coupled to the oxygen vacancy reservoir and the second wire. In addition, the finite oxygen vacancy reservoir may have a volume or oxidizing power to exchange limited amount of oxygen ions and oxygen vacancies required for switching the conductive filament with the variable resistive layer.

The variable resistive layer may include a metal oxide having a stoichiometric composition or the oxygen deficient-composition. Further, the metal oxide may include at least one selected from the group consisting of tantalum (Ta), titanium (Ti), zirconium (Zr), vanadium (V), chrome (Cr), niobium (Nb), osmium (Os), manganese (Mn), iron (Fe), nickel (Ni), copper (Cu), silver (Ag), zinc (Zn), hafnium (Hf), and tungsten (W).

The variable resistive layer may include a metal oxide. In this case, the oxygen vacancy reservoir may have an oxidation potential energy lower than the metal oxide of the variable resistive layer having an oxidization potential energy. The oxygen vacancy reservoir may include at least any metal of tantalum (Ta), titanium (Ti), zirconium (Zr), vanadium (V), tungsten (W) and ruthenium (Ru), or a metal oxide thereof.

The volume of the oxygen vacancy reservoir may be determined in consideration of at least one of the number of oxygen vacancies required to constitute the conductive filament, the average diameter of the conductive filament, and the degree of solubility of oxygen at room temperature of the oxygen vacancy source. The first electrode may comprise a non-reactive metal having a lower oxidizing power than a material in the oxygen vacancy reservoir.

The oxygen vacancy reservoir may be locally disposed on a part of the variable resistive layer. The average thickness of the oxygen vacancy reservoir may be in the range of 3 to 20 times as the thickness of the variable resistive layer.

According to another embodiment of the present disclosure in order to solve the above-mentioned problems, there is provided a resistive memory device comprising a first electrode electrically coupled with a first wire; a second electrode facing the first electrode and being electrically coupled with a second wire; and a memory cell including a variable resistive layer and being disposed between the first electrode and the second electrode, the variable resistive layer having a conductive bridge that includes metal ions and that connects the first electrode and the second electrode. The first electrode may include a contact electrode electrically coupled with the first wire and an ion storage source disposed on the contact electrode, and the ion storage source may have a volume or ionization degree to exchange limited amount of metal ions required for switching the conductive bridge with the variable resistive layer.

The variable resistive layer may include a solid electrolyte containing at least one of chalcogenide and metal oxide. In one example, the volume of the ion storage source may be based on at least one of the number of the metal ions in the conductive bridge, a volume of the conductive bridge, and an ionization degree of the conductive bridge. The ion storage source may include at least one of silver (Ag), tellurium (Te), copper (Cu), nickel (Ni), and zinc (Zn).

The ion storage source may be locally disposed on the contact electrode. Further, the ion storage source may have a tip portion. The average thickness of the ion storage source may be in the range of 3 to 20 times as the thickness of the variable resistive layer.

According to another aspect of the present disclosure, there is provided a resistive memory device comprising the steps for providing a conductive layer, the conductive layer being an electrode; forming a screen mask on the conductive layer, the screen mask having openings that expose portions of a surface of the conductive layer; forming, using a physical vapor deposition, an oxygen vacancy reservoir or an ion storage source on the exposed portions of the conductive layer, the oxygen vacancy reservoir or the ion storage source having a tip portion; removing the screen mask; and forming a variable resistive layer on the oxygen vacancy reservoir or the ion storage source.

According to another aspect of the present disclosure, there is provided a resistive memory device comprising the steps for providing a variable resistive layer; forming a screen mask on the variable resistive layer, the screen mask having openings that expose portions of a surface of the variable resistive layer; forming, using a physical vapor deposition, an oxygen vacancy reservoir or an ion storage source having a tip portion on the exposed portions of the variable resistive layer; and removing the screen mask.

According to an aspect of one embodiment of the present disclosure in order to solve the above-mentioned problems, there is provided a resistive memory device, wherein an oxygen storage source having a limited space and thickness is provided in consideration of the number of oxygen vacancy required for configuring a reversible conductive filament in a variable resistive layer, so that durability of set operation and reset operation using the switching mechanism of the resistive memory element can be improved, and uniformity between switching cycles, reliability and durability of the switching mechanism can be improved by securing reversible resistance switching, and as a result, excellent data retention performance and a long-life cycle can be realized.

In connection with the resistive memory element according to another embodiment of the present disclosure, a resistive memory element having the aforementioned advantages can be provided by forming an ion storage source as a dot shape which has a volume calculated from the number of metal ions necessary for forming a reversible conductive bridge in the variable resistive layer.

According to another aspect of the present disclosure in order to solve the other technological problems, there is provided a method of fabricating a resistive memory device, which is easy to manufacture and has a long life and reliability.

BRIEF DESCRIPTION OF THE DRAWINGS

The above and other features and advantages of the present disclosure will become more apparent from the following embodiments and the attached drawings in which.

DETAILED DESCRIPTION OF THE INVENTION

Figure 1:
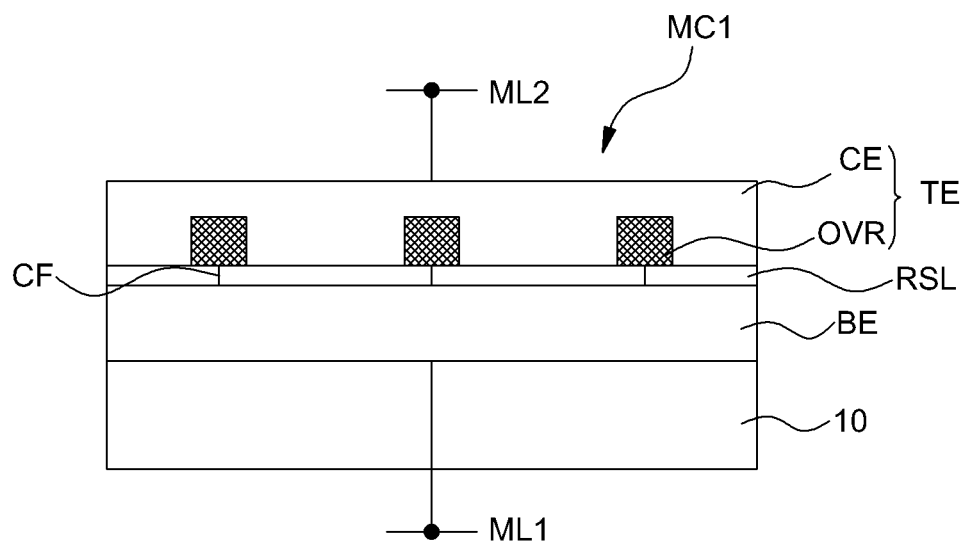
FIG. 1 is a cross-sectional diagram illustrating a memory cell according to an embodiment of the present disclosure.

Hereinafter, preferred embodiments of the present disclosure will be described in detail with reference to the accompanying drawings.

While the present disclosure has been particularly shown and described with reference to exemplary embodiments thereof, it is evident that many alternatives, modifications and variations will be apparent to those skilled in the art. The present disclosure is not limited to the following embodiments. Rather, these embodiments are provided so that this disclosure will be described to the present disclosure more precisely and completely, and will fully convey the spirit of the invention to those skilled in the art.

In the drawings, the same reference numerals denote the same elements. Also, as used herein, the term, "and/or" includes any and all combinations of any of the listed items.

The terms used herein are used to illustrate the embodiments and are not intended to limit the scope of the invention. Also, although described in a singular type, the present disclosure may include plural forms unless the context clearly indicates the singular value. It is also to be understood that "comprise" and/or "comprising" as used herein should be interpreted as specifying the presence of mentioned shapes, numbers, steps, operations, elements, groups thereof and/or does not exclude the presence or addition of other shapes, numbers, operations, elements, and/or groups thereof.

In this specification, reference herein to a layer formed "on" a substrate or other layer refers to a layer formed directly on top of the substrate or other layer, or an intermediate formed on the substrate or other layer, or the layer formed on the intermediate layers. It will also be understood by those skilled in the art that structures or shapes that are "adjacent" to other features may have portions that overlap or are disposed below the adjacent features.

As used herein, the terms. "below," "above," "upper," "lower," "horizontal," or "vertical" may be used to describe the relationships between one constituting member, layer or regions, and other constituting members, layers or regions, as shown in the Figures. It should be understood that these terms are intended to encompass not only the directions indicated in the Figures but also the other directions of the devices.

In the following, embodiments of the present disclosure will be described with referring to the cross-sectional diagrams schematically illustrating ideal embodiments and intermediate structures of the present disclosure. In these figures, for example, the size and shape of the members may be exaggerated for convenience and clarity of explanation, and in actual implementation, variations of the illustrated shape may be expected. Accordingly, the embodiments of the present disclosure should not be construed as limited to the specific shapes of the regions shown herein. In addition, reference numerals of members in the drawings refer to the same members throughout the drawings.

The inventors of the present disclosure have recognized that since oxygen vacancy source or metal ion storage source in the electrodes for forming conductive paths, for example, conductive filaments or conductive bridges in a conventional variable resistive layer are substantially unlimited sources, oxygen vacancies or metal ion are excessively transferred into the variable resistive layer via a forming operation or repeated switching operation, thereby resulting in deterioration of reliability of a switching operation. The following embodiments according to the present disclosure provide various resistive memory devices including a finite oxygen vacancy reservoir or finite ion storage source which can suppress or limit an excessive supply of the oxygen vacancies or metal ions into a matrix surrounding conductive paths in a variable resistive layer so as to improve a reversibility of the conductive path formed in the variable resistive layer undergoing the repeated switching processes. In addition, the following embodiments provide method of fabricating the same.

Figure 2A:
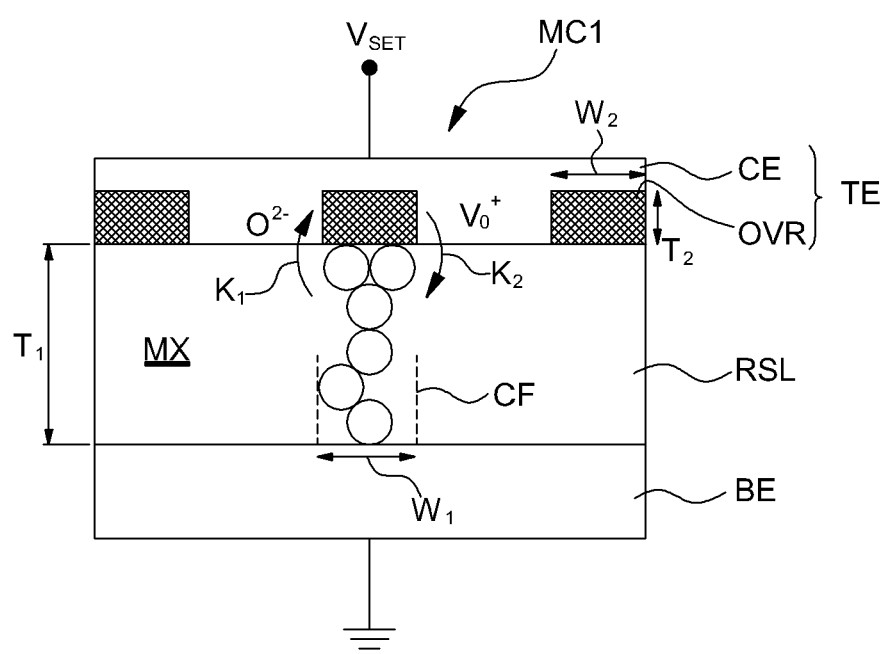
FIG. 2A and FIG. 2B are cross-sectional diagrams illustrating a switching operation of a memory cell and a switching operation of a conventional memory cell according to an embodiment of the present disclosure, respectively.
Figure 2B:
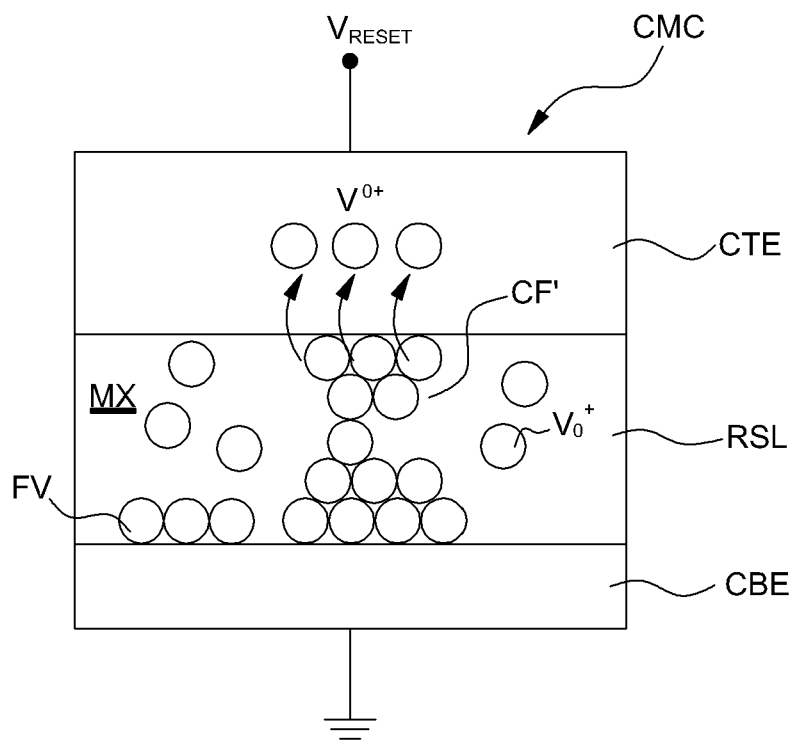

FIG. 1 is a cross-sectional diagram showing a memory cell MC1 according to an embodiment of the present disclosure. FIGS. 2A and 2B are cross-sectional diagrams illustrating switching operation of the memory cell MC1 according to an embodiment of the present disclosure and a conventional memory cell CMC, respectively.

Referring to FIGS. 1 and 2A, a memory cell MC1 may include a first electrode BE and a second electrode TE formed on a substrate 10. The first electrode BE and the second electrode TE may face each other. The first electrode BE and the second electrode TE may not be limited to a two-dimensional plane configuration. For example, the first electrode BE and the second electrode TE may have various three-dimensional configurations such as a rod or a cylinder or pipe surrounding the rod. A variable resistive layer RSL may be disposed between the first electrode (BE) and the second electrode (TE). The substrate 10 may not limited to a silicon-based semiconductor material, but may be a compound semiconductor, a polymeric material, a ceramic material, or a composite material of two or more thereof.

In an embodiment, the first electrode BE may be one of the lower electrode and the upper electrode for the memory cell MC. The first electrode BL may be formed of an active layer of the substrate 10, doped silicon, tungsten (W), gold (Au), platinum (Pt), palladium (Pd), rhodium (Rh), iridium (Ir), ruthenium (Ru), titanium (Ti), tantalum (Ta), molybdenum (Mo), chromium (Cr), vanadium (V), conductive nitride of these metals, conductive silicon oxide of these metals, or a combination thereof. Either the first electrode BE or the second electrode BE may be a non-reactive electrode having weak or no reactivity with oxygen ions. In the embodiment shown in FIG. 1, the first electrode BE may be a non-reactive electrode. For example, as will be described later, the first electrode BE may be a non-reactive metal having a lower oxidizing power than the oxygen vacancy reservoir OVR in the second electrode TE, and may be selected from tungsten (W), gold (Au), platinum (Pt), palladium (Pd), rhodium (Rh), iridium (Ir), ruthenium (Ru), titanium (Ti), molybdenum (Mo), chromium (Cr), vanadium (V), conductive nitrides of these metals, conductive silicates of these metals, conductive oxides of these metals, and composite materials thereof.

The variable resistive layer RSL may be a metal oxide layer. In one embodiment, the variable resistive layer RSL may comprise an oxide of a transition metal. For example, the variable resistive layer RSL may include one oxide selected from tantalum (Ta), scandium (Sc), yttrium (Y), titanium (Ti), zirconium (Zr), vanadium (V), chromium (Cr), niobium (Nb), osmium (Os), manganese (Mn), iron (Fe), nickel (Ni), copper (Cu), silver (Ag), zinc (Zn), hafnium (Hf), and tungsten (W). These materials are illustrative, and the present disclosure is not limited thereto. For example, the variable resistive layer RSL may include a known perovskite-based oxide exhibiting a switching characteristic of resistance value by an electric pulse. The variable resistive layer RL according to the embodiment of the present disclosure may be any one of a unipolar material whose switching characteristic is independent of the polarity of the applied voltage or a bipolar resistance material which exhibits switching characteristics opposite to each other with different polarities, but the present disclosure is not limited thereto.

The variable resistive layer RSL may have a stoichiometric composition or an oxygen deficient composition. Preferably, the variable resistive layer RSL may be an oxide of a metal having a higher oxidation potential energy than an oxygen vacancy reservoir OVR of the second electrode (TE). For example, when the oxygen vacancy reservoir OVR may include tantalum (Ta) as described below, the variable resistive layer RSL may preferably contain hafnium oxide ($HfO_2$) rather than tantalum oxide ($Ta_2O_5$).

The second electrode TE formed on the variable resistive layer RSL may include oxygen vacancy reservoir OVR and contact electrode CE. The oxygen vacancy reservoir OVR may be locally distributed as a dotted pattern. The contact electrode CE may be electrically connected to the oxygen vacancy reservoir OVR, and may be electrically connected to a wire ML2. The contact electrode CE may be a conductive electrode layer that continuously covers the top of an oxygen vacancy reservoir OVR while filling the gap between oxygen vacancy reservoir OVR.

The oxygen vacancy reservoir OVR may include a metal or an oxide of the metal which has a variable oxidation potential depending on the direction of an electric field by having an appropriate oxidation potential energy. In one embodiment, the metal may comprise at least one of tantalum (Ta), titanium (Ti), zirconium (Zr), vanadium (V), tungsten (W), and ruthenium (Ru). For example, the oxygen vacancy reservoir OVR may be tantalum, tantalum oxide or mixtures thereof. Oxygen can be dissolved within a predetermined range in the oxygen vacancy reservoir OVR and exchanges oxygen and oxygen vacancies with the variable resistive layer RSL during resistive switching operation of the memory cell MC1. For example, in a set operation, the conductive filament CF may be restored by the oxygen vacancy supplied from the oxygen vacancy reservoir OVR and then the variable resistive layer RSL may be switched to a low resistance state. In a reset operation, the oxygen vacancies of conductive filament may be supplied from the oxygen vacancy reservoir OVR and then the variable resistive layer RSL may be switched to a high resistance state by at least partial breakage of the conductive filament CF.

The volume of the oxygen vacancy reservoir OVR according to the embodiment of the present disclosure can be determined in consideration of the number of oxygen vacancies required to constitute the conductive filament CF formed in the variable resistive layer RSL. Table 1 below shows that the variable resistive layer RSL is a hafnium oxide having a thickness (T1) of 1 nm and the average diameter W1 of the conductive filament CF formed in the hafnium oxide is 1 nm. It is the result of simulating the volume of oxygen vacancy reservoir OVR. At this time, the diameter of the oxygen vacancy reservoir OVR may be inferred by simulation, assuming that the oxygen vacancy reservoir OVR was a circular disk shape having a thickness (T2) of 10 nm. The average diameter W1 of the assumed conductive filament CF and the thickness T2 of the oxygen vacancy reservoir OVR are illustrative, and the present disclosure is not limited thereto.

TABLE 1

| Specification of conductive filament CF | | Specification of Oxygen Conservation Reservoir OVR | |
| --- | --- | --- | --- |
| T1 (nm) | 1 | T2 (nm) | 20 nm |
| W1 (nm) | 1 | W2 (nm) | 1.11 nm |
| Density (g/nm$^3$) | 9.68 × 10$^{-21}$ | Density (g/nm$^3$) | 1.69 × 10$^{-21}$ |
| Molecular Weight (g/mol) | 210.49 | Molecular Weight (g/mol) | 180 |
| Total weight (g) | 7.60 × 10$^{-21}$ | Total weight (g) | 6.50 × 10$^{-19}$ |

Referring to Table 1, the number of molecules (HfO$_2$) of hafnium oxide in the volume occupied by the conductive filament CF in the variable resistive layer RSL is 21.75. At this time, the number of oxygen in the volume of the conductive filament CF is 43.50 which is twice the number of hafnium oxide molecules. Based on this fact, the number of oxygen vacancies for forming the conductive filament CF can be estimated. In one embodiment, it is assumed that the number of oxygen vacancies is about 50% of the number of oxygen atoms. Therefore, there are 22 oxygen vacancies for forming the conductive filament CF. However, in general, the number of oxygen vacancies may be designed to be from about 5% to 90% of the number of oxygen atoms in the volume of the conductive filament CF. In order to calculate the volume of the oxygen vacancy reservoir OVR for supplying 22 oxygen vacancies into the variable resistive layer RSL, it is assumed that the two-component Ta—O composition had a concentration of oxygen of 1%. This assumption is illustrative and the concentration of oxygen of solid solubility may be 50%.

Assuming that the oxygen concentration of solid solubility in the OVR is 1%, the number of tantalum (Ta) is 2175.08. In this regard, the size of an oxygen vacancy reservoir OVR containing tantalum (Ta) as a main component can be determined, and the diameter W2 of an oxygen vacancy reservoir OVR having a thickness T2 of 10 nm corresponds to 1.11 nm. That is, the volume of the OVR may be determined corresponding to the size of the conductive filament CF. However, when formed with the same area as the resistive switching layer RSL, with a size larger than the calculated size, for example, 10 nm, as in conventional resistive memory devices, the oxygen vacancy reservoir OVR may become actually an infinite storage source of oxygen vacancy.

However, in consideration of the fact that the diameter W1 of the conductive filament CF is several nm, for example, about 1 nm, according to the embodiment of the present disclosure, the oxygen vacancy reservoir OVR may be locally disposed on a partial portion of the variable resistive layer RSL as shown in FIG. 1 and FIG. 2A, so that a limited number of metal elements can be included, and thereby only the oxygen and oxygen vacancies can be exchanged to the degree that the oxygen vacancy reservoir OVR is required for the reversible switching of the conductive filament CF.

In one embodiment, the preferred volume of the oxygen vacancy reservoir OVR may be generally larger than the volume of the formed filaments, and the size thereof will become larger as the saturation oxygen solubility of the oxygen vacancy reservoir OVR is getting lower and lower. In the above example, assuming the oxygen solubility of the oxygen vacancy reservoir OVR, that is Ta as 1%, the size of the oxygen vacancy reservoir OVR corresponding to the conductive filament having a length of 1 nm and a diameter of 1 nm is as follows. The height is 10 nm and the diameter is 1.1 nm. In case of a material in which OVR has an oxygen solubility of 0.5%, the size of the OVR must be 1.55 nm in diameter for the same height of 10 nm. In case of material with an oxygen solubility of 2% should have a diameter of 0.78 nm for the same height of 10 nm. However, in the case where the diameter is a sub-nanometer size, since the diameter is not the size that the reproducibility can be realized, it is better to reduce the height to 5 nm for the same diameter of 1.1 nm in this case.

In one embodiment, the average thickness of the oxygen vacancy reservoir OVR may be at least 3 to 20 times as the thickness of the variable resistive layer RSL. In this case, the oxygen vacancy reservoir OVR may be in a dot shape with a thickness according to the average thickness of the conductive filament CF. When the average thickness of the oxygen vacancy reservoir OVR is less than 3 times as the thickness of the variable resistive layer RSL and therefore the oxygen vacancy reservoir OVR cannot have an enough oxygen solubility, the width of the oxygen vacancy reservoir OVR may have to be extended excessively more than the width of the conductive filament CF in order to secure an effective amount of oxygen vacancies, and therefore, for an operation, oxygen vacancies may be supplied to the matrix region around the conductive filament CF, thereby reducing the resistance of the matrix and resulting in device failure or error. In addition, when the average thickness of the oxygen vacancy reservoir OVR exceeds 20 times as the thickness of the variable resistive layer RSL, the width of the oxygen vacancy reservoir OVR may be reduced below a critical value for forming the oxygen vacancy reservoir OVR, and then the reproducible formation of the oxygen vacancy reservoir OVR becomes difficult. Furthermore, since the contact area with the variable resistive layer RSL is too small, it may be difficult to exchange oxygen and oxygen vacancies with the variable resistive layer RSL.

If the number of the oxygen vacancy reservoir OVR is greater than or equal to 2, the oxygen vacancy reservoir OVR may be spaced apart from each other. In addition, according to the embodiment of the present disclosure, the oxygen vacancy reservoir OVR may be formed to have a thickness and a diameter designed to provide a finite oxygen vacancy in the variable resistive layer RSL. For example, the oxygen vacancy reservoir OVR may have a dot shape having designed thickness and diameter, or designed volume.

Referring to FIG. 2A, when a positive set voltage $V_{SET}$ is applied to the second electrode TE in a set operation of the memory cell MC1, oxygen ions $O^{2-}$ and oxygen vacancy $V_O^+$ may be exchanged in a limited concentration between the variable resistive layer RSL and the oxygen vacancy reservoir OVR, respectively, as shown by arrows K1 and K2. If the oxygen vacancies are supplied to the RSL more excessively than the required amount, superfluous oxygen vacancies may be accumulated in the matrix region MX and, if such operations are repeated, an undesired electrical conductance appears in the matrix MX and excessively reduces device resistance. This may incur excessive consumption of electric power in the subsequent reset process, and repeating this process may ultimately lead to device failure. However, according to the embodiment of the present disclosure, superfluous oxygen vacancies in the matrix MX can be suppressed because excessive oxygen vacancies are not supplied to the variable resistive layer RSL by the set operation. As a result, the reliability and life time of the memory cell can be improved.

Unlike this case, referring to FIG. 2B, a conventional memory cell CMC includes a first electrode CBE and a second electrode CTE and a variable resistive layer (not shown) between the first electrode CBE and the second electrode CTE. The first electrode CBE is substantially an infinite source of oxygen vacancies. Thus, unlike the one shown in FIG. 2A, in a set operation, an excess supply of oxygen vacancies can occur into the matrix MX of the variable resistive layer RSL, and the superfluous oxygen vacancies FV after the formation of the conductive filament CF may be accumulated or deposited in the matrix MX of the resistance layer RSL. In this case, the resistance of the matrix MX is reduced, and accordingly, the variable resistive layer RSL may have a resistance component in which the resistance of the conductive filament CF and the resistance of the matrix MX having the reduced resistance value are connected in parallel.

The resistance of the matrix MX itself constituting the parallel resistance to the conductive filament CF formed in the variable resistive layer RSL is reduced, and thereby hindering the reset process of the conductive filament CF, and also increasing the reset voltage $V_{RESET}$ and the reset current $I_{RESET}$. In this way, when the reset voltage $V_{RESET}$ is increased, and then the reset voltage $V_{RESET}$ with negative polarity is applied during the actual reset operation, the reverse filament CF' growing reversely from the opposite electrode facing an oxygen storage reservoir CTE, that is, the first electrode CBE is generated, thereby resulting in a negative set phenomenon in which the set process occurs. This failure of the reset process may cause SET stuck fail or may cause a permanent property change in the variable resistive layer RSL, and thereby generating dispersion of the switching parameters such as a set voltage, a reset voltage, and resistance values such as a HRS and a LRS, and the durability, and as a result, failure can occur for each memory cell and/or each memory device. Through these comparative examples, it can be clearly appreciated by those skilled in the art that reliable reversibility of the conductive filament is ensured, according to embodiments of the present disclosure having a limited capacity of oxygen vacancy reservoir OVR.

In the embodiment of the present disclosure disclosed with reference to FIG. 1 through FIG. 2B, the locally disposed or dot-shaped oxygen vacancy reservoir OVR may have a top flat disk shape, as described above. The planar cross-section of the disc shape may have a circular shape, an elliptical shape, a polygonal shape such as a quadrangle, or a combination thereof, and the present disclosure is not limited thereto. In an example, the oxygen vacancy reservoir having a top flat disk shape can be formed through patterning by photolithography which is well known in the art.

In another embodiment, the dot shape of the oxygen vacancy reservoir can have a tip top, as shown in FIG. 6, described below. The oxygen vacancy reservoir having the tip top may have the shape of a pyramid, cone, or elliptical horn. As described above, the dot-shaped oxygen vacancy reservoir having the tip-shaped top may be formed by forming a screen mask on the variable resistive layer RSL having an opening exposing a region where an oxygen vacancy reservoir is to be formed, and forming the oxygen vacancy reservoir on the variable resistive layer RSL, and then removing the screen mask, which will be described later in detail with reference to FIG. 6.

The second electrode TE can be completed by forming a limited capacity of oxygen vacancy reservoir OVR in a dot shape and then forming the contact electrode CE on the oxygen vacancy reservoir OVR. The contact electrode CE may be formed to extend the contact area for low resistance contact with the line ML2 and may be made of a non-reactive or non-oxidizing conductive material, for example, the rare-earth metals such as tungsten, platinum, iridium and rosin, conductive oxides, conductive nitrides, or combinations thereof, so that it cannot function as an additional oxygen vacancy reservoir.

Figure 3:
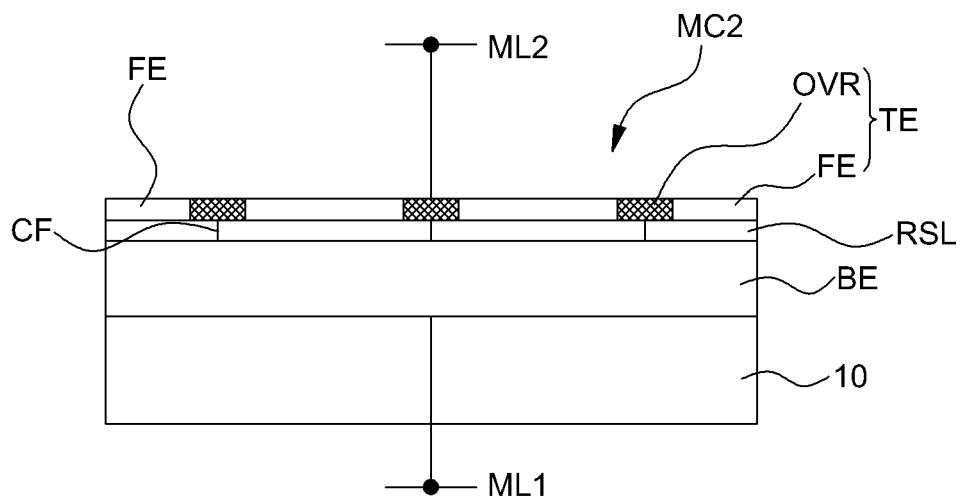
FIG. 3 illustrates a memory cell according to another embodiment of the present disclosure.

FIG. 3 shows a memory cell MC2 according to another embodiment of the present disclosure. The above-mentioned disclosure may be referred to with respect to the elements of FIG. 3 having the same reference denotations as those of FIG. 2.

Referring to FIG. 3, the memory cell MC2 may include a first electrode BE, a variable resistive layer RSL, and a second electrode TE. The second electrode TE may include a filler electrode FE between oxygen vacancy reservoirs OVR having a dot shape and limited capacity formed on the variable resistive layer RSL. The filler electrode FE may provide a flat contact surface over the whole area of the memory cell MC2 since the filler electrode FE has the same upper level as the upper level of the oxygen vacancy reservoir OVR. The contact area may be expanded for low-resistance contact with the wire MC2.

The filler electrode FE may be formed of a non-reactive or non-oxidizable conductive material so as not to function as an additional oxygen vacancy supply source. For example, the filler electrode FE may comprise the rare-earth metals such as tungsten, platinum, iridium, and rhodium, a conductive oxide, a conductive nitride, or a combination thereof.

Figure 4:
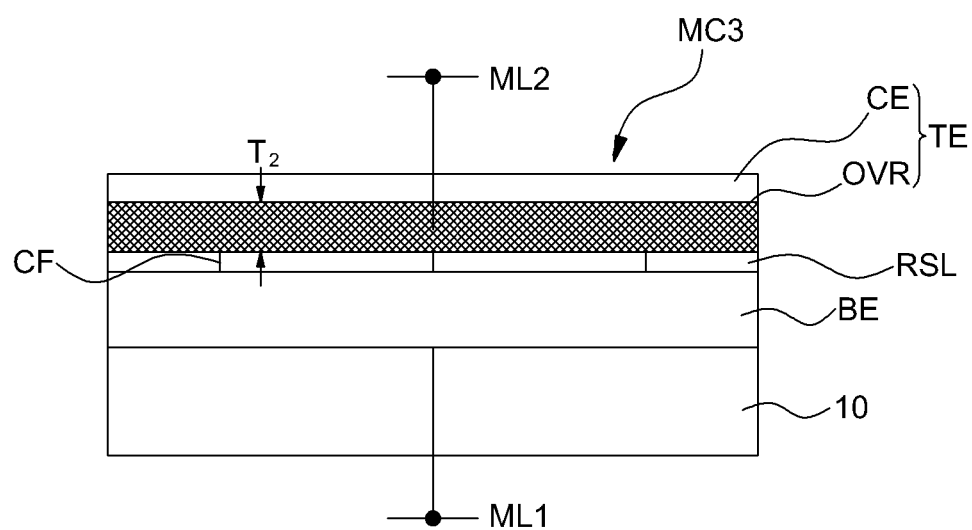
FIG. 4 illustrates a memory cell according to another embodiment of the present disclosure.

FIG. 4 shows a memory cell MC3 according to another embodiment of the present disclosure. In connection with the disclosed elements, the above-mentioned contents may be referred to for the elements having the same reference denotations as those of the above-mentioned elements disclosure.

Referring to FIG. 4, the second electrode TE of the memory cell MC3 includes an oxygen vacancy reservoir OVR and a contact electrode CE on the oxygen vacancy reservoir OVR. The oxygen vacancy reservoir OVR may be formed on the variable resistive layer RSL with the same area as the variable resistive layer RSL. The thickness of the oxygen vacancy reservoir OVR have to be limited so that the flat oxygen vacancy reservoir OVR may be a limited volume as oxygen vacancy supply source.

Table 2 shows the results obtained by simulating the thickness of the oxygen vacancy reservoir of tantalum (Ta) calculated when assuming the variable resistive layer RSL is formed of hafnium oxide having a horizontal cross section in the shape of a quadrangle having a thickness of 1 nm and a width of 20 nm, an average diameter of the conductive filament CF formed in the variable resistive layer is 1 nm, and the width of the oxygen vacancy reservoir OVR is 20 nm to have the same area as the variable resistive layer RSL. The dimensions assumed in Table 2 are exemplary and may vary depending on the design rule for the memory cell and the material of the variable resistive layer RSL, and the present disclosure is not limited thereto.

TABLE 2

| Specification of conductive filament | | Specification of oxygen vacancy reservoir | |
|---|---|---|---|
| Assumed thickness (nm) | 1 | Inferred thickness (nm) | 0.062 nm |
| Diameter (nm) | 1 | Width (nm) | 20 nm |
| Density (g/nm$^3$) | 9.68 × 10$^{-21}$ | Density (g/nm$^3$) | 1.69 × 10$^{-21}$ |
| Molecular Weight (g/mol) | 210.49 | Molecular Weight (g/mol) | 180 |
| Total weight (g) | 7.60 × 10$^{-21}$ | Total weight (g) | 6.50 × 10$^{-19}$ |

Referring to Table 2, as indicated in Table 1, the number of molecules (HfO$_2$) of hafnium oxide in the volume occupied by the conductive filament CF in the variable resistive layer RSL is 21.75. At this time, the number of oxygen in the volume of the conductive filament CF is 43.50, which is twice the number of molecules of hafnium oxide. Based on this fact, the number of oxygen vacancies for forming the conductive filament CF may be estimated. In one embodiment, it is assumed that the number of oxygen vacancies is about 50% of the number of oxygen atoms. Therefore, there are 22 oxygen vacancies for forming the conductive filament CF.

In order to calculate the volume of the oxygen vacancy reservoir OVR for supplying 22 oxygen vacancies into the variable resistive layer RSL, assuming that the two-component Ta—O composition has a concentration of oxygen of 1% to form a perfect solid solution at a room temperature, the number of tantalum (Ta) is 2175.08. In this regard, the size of an oxygen vacancy reservoir OVR containing tantalum (Ta) as a principal component may be determined, and volume of the oxygen vacancy reservoir OVR may be 19.34 nm$^3$. Therefore, the thickness of oxygen vacancies may be calculated to be 0.062 nm. However, such a thickness is thinner than thickness of a single atomic layer and cannot be practically implemented. Therefore, it is desirable to use an oxygen vacancy reservoir OVR having a lower oxidation potential that can limit the supply of oxygen vacancies as described below.

Although the above-described simulation assumes that one conductive filament is formed in the variable resistive layer, two or more conductive filaments may be formed, and the thickness of the oxygen vacancies may increase as the number of conductive filaments increases. However, when the thickness of the oxygen vacancy reservoir OVR is increased, if the assumed number of conductive filaments are not actually formed in the variable resistive layer, excess oxygen vacancies may be supplied into the matrix of the variable resistive layer RSL to cause excessive oxygen vacancies. In this case, decrease in a resistance value of the matrix may cause problems such as reset fail. Therefore, it can be designed such that the thickness of the oxygen vacancy reservoir can be determined from the number of oxygen vacancies required for the conductive filaments corresponding to the average number of the conductive filaments formed in the actual variable resistive layer in the memory cell.

In yet another embodiment, the thickness of the oxygen vacancy reservoir OVR may be determined by the magnitude of an oxidizing power of a material that constitutes the oxygen vacancy reservoir OVR. For example, when using a metal material having a small oxidizing power such as tungsten (W), the thickness of the oxygen vacancy reservoir may be further increased as compared with the case of using a metal material such as tantalum having a large oxidizing power. The advantage of this approach is that if the design rule is less than 20 nm then the material of the oxygen vacancies will be smaller than a critical thickness of the material that can actually form a continuous thin film, the use of a material having a small oxidizing power may increase the thickness margin of the oxygen vacancy reservoir OVR, thereby making it possible to obtain a reproducible fabricating process of the memory cell. As described above, the second electrode TE can be completed by forming a thin film of oxygen vacancy reservoir OVR having a limited thickness on the variable resistive layer RSL, and then forming the contact electrode CE.

Figure 5:
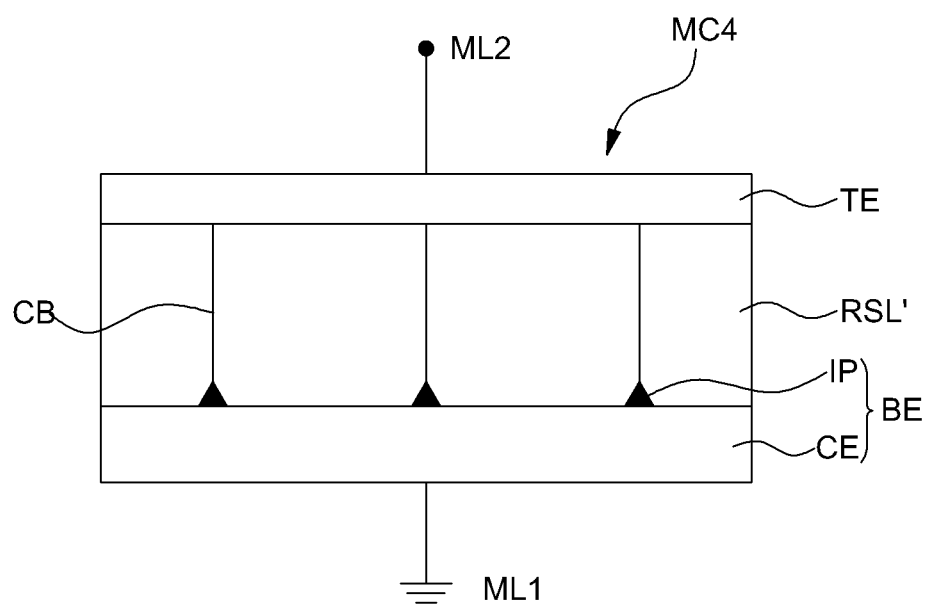
FIG. 5 illustrates a structure of a memory cell according to another embodiment of the present disclosure.

FIG. 5 illustrates a structure of a memory cell MC4 according to another embodiment of the present disclosure, and FIGS. 6A to 6J are the cross-sectional diagrams illustrating a method for fabricating a nonvolatile memory device for fabricating the memory cell MC4 of FIG. 5.

Referring to FIG. 5, the memory cell MC4 is a memory cell of another resistive memory device. Unlike the conductive filament, it is a memory cell having a resistive switching mechanism based on a conductive bridge CB formed according to electrochemical metallization (ECM). The memory cell MC4 may include a first electrode BE, a second electrode TE and a variable resistive layer RSL' between the first electrode BE and the second electrode TE.

The variable resistive layer RSL' may be a solid electrolyte film which is well known in the art. The solid electrolyte film may include, for example, an electrolyte material having super-ion regions. The memory cell MC4 may exhibit resistance change or switching characteristics by reversibly changing the conductive bridge CB through physical rearrangement of the super-ion regions in the matrix made of the electrolyte material. For example, in the set operation, the conductive bridge CB may be restored by the metal ions supplied from the first electrode BE and then may be switched to the low resistance state. In the reset operation, the metal ions of the conductive bridge CB may be switched to the high resistance state by at least partial breakage of the conductive bridge CB while returning to the electrode BE.

The electrolyte material having the super-ion regions may include chalcogenide glass or chalcogenide, such as, for example, cadmium sulfide (CdS), and germanium selenium compound (GeSe) materials. Other known metal oxide materials such as SiO$_2$, TiO$_2$, or Ta$_2$O$_5$ and the like may be used as the solid electrolyte film.

The first electrode BE may include a contact electrode CE for electrical connection with the wire ML1 and an ion storage source IP in the form of a dot on the contact electrode CE. The contact electrode CE may comprise a non-reactive conductive material. For example, the contact electrode CE may be formed of a metal such as tungsten (W), gold (Au), platinum (Pt), palladium (Pd), rhodium (Rh), iridium (Ir), ruthenium (Ru), molybdenum (Mo), chromium (Cr), vanadium (V), conductive nitride of these metals, conductive silicon oxide of these metals, and conductive oxide of these metals.

The ion storage source IP may include a dot-shaped metal structure capable of supplying metal cations for forming the conductive bridge CB in the variable resistive layer RSL. For example, the ion source IP may comprise a reactive metal such as silver (Ag), tellurium (Te), copper (Cu), nickel (Ni), or zinc (Zn). As described above with reference to Tables 1 and 2, it may be a finite ion source that can supply the limited metal cations by the amount calculated in consideration of the volume and ionization degree of the conductive bridge CB so that the metal cations supplied from the ion storage source IP are not excessively supplied into the variable resistive layer RSL. For this purpose, the ion source IP may have a dot shape, and the width and height of the dot shape may be determined.

In one embodiment, the average thickness of the ion storage source IP may be in the range of 3 to 20 times as the thickness of the variable resistive layer RSL. In this case, a dot-shaped ion storage source IP having a degree corresponding to the average thickness of the conductive bridge CB can be formed. In the case where the average thickness of the ion storage source IP is less than 3 and the ion storage source IP does not have sufficient ionization degree, the width of the ion storage source IP may have to be expanded, and then ions may be supplied excessively to reduce the resistance of the matrix, resulting in the device failure. In addition, when the average thickness of the ion storage source IP exceeds 20 times, the width of the ion storage source IP may be reduced below the threshold value, so that the reproducible formation may be difficult, and the exchange of metal ions for switching may also become difficult.

The dot-shaped metal cation may have a disk shape having a flat upper portion or may have a shape such as a pyramid or a cone having a tip portion, but the present disclosure is not limited thereto. In FIG. 5, the ion storage source IP having a tip portion is illustrated. The tip portion has an advantage that it is possible to facilitate the release of metal ions from the ion storage source IP by utilizing an electric field concentration effect generated according to an electric field applied between the first electrode BE and the second electrode TE.

The memory cell MC4 may be fabricated by forming the variable resistive layer RSL' on the ion storage source IP and forming the second electrode TE on the variable resistive layer RSL'. The second electrode TE may include at least one of the materials listed as the contact electrode CE of the first electrode BE, but the present disclosure is not limited thereto.

When metal cations are supplied excessively into the variable resistive layer RSL' at each repeated switching of the memory cell MC4, the resistance of the matrix of the solid electrolyte may be reduced and, as described with reference to FIG. 2B, a failure may be caused that induces a set operation to occur in the reset switching from a low resistance state to the high resistance state. However, according to the embodiment of the present disclosure, the metal cations are supplied by the amount as designed into the variable resistive layer RSL', and the metal cations are limitedly involved in only the set operation and the reset operation of the conductive bridge CB, and propagation of the metal cations into the neighboring matrix may be suppressed. As a result, a material limited resistive switching can be induced.

The resistive memory element including the limited ion storage source IP according to the embodiment of the present disclosure may improve the cycle-to-cycle uniformity of the electrochemical metallization type nonvolatile memory element and improve the switching durability of the conductive bridge. In the above-described embodiments, the ion storage source IP may be formed in the first electrode BE, but the present disclosure is not limited thereto. For example, the ion storage source IP may be formed in the second electrode TE. Also, the first electrode BE is the anode, the second electrode TE is the cathode, and vice versa.

Figure 6A:
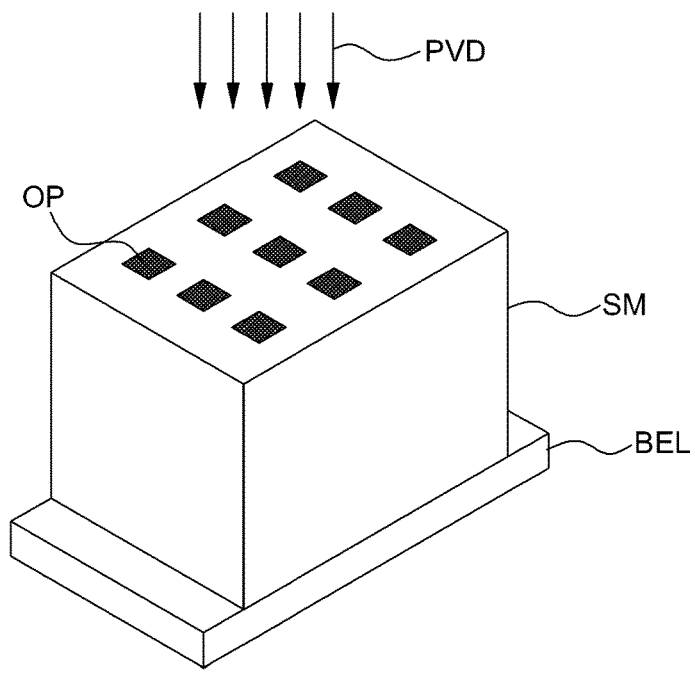
FIG. 6A to FIG. 6J are cross-sectional diagrams illustrating a method of fabricating a non-volatile memory device for fabricating the memory cell of FIG. 5.

Referring to FIG. 6A, a first conductive layer BEL for forming a first electrode formed on a substrate (not shown) may be formed. A screen mask SM having openings OP exposing a part of the surface of the first conductive layer BEL may be formed on the first conductive layer BEL. The density and size of the openings OP may be equal to the number of ion storage sources IP designed for each memory cell.

The screen mask SM may be a photoresist, and a hard mask film such as silicon oxide or silicon nitride. The openings OP of the screen mask SM may be formed such that the evaporation species transferred in a line of sight motion through the openings OP as indicated by arrows can be deposited with the tip portion formed on a part of the surface of the first conductive layer BEL. It may have an aspect ratio suitable for being deposited with the tip portion formed.

Figure 6B:
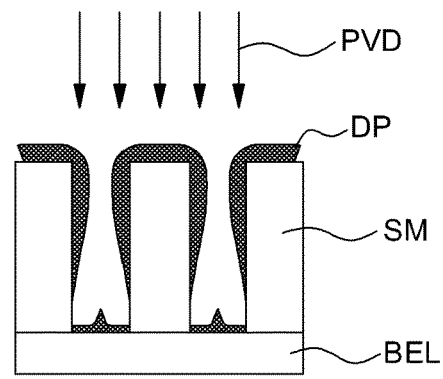
Figure 6B:
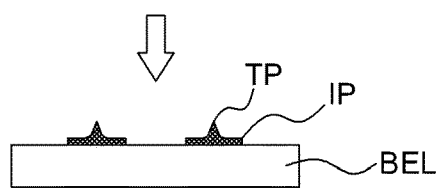

Referring to FIG. 6B, the deposition process for forming the ion storage source IP may be physical vapor deposition such as sputtering in which the deposition species have a straight-line property, or an evaporation method. The deposition process may deposit deposition species DP on the upper surface of the screen mask SM, the sidewalls, and the exposed region of the first conductive layer BEL. As the deposition process of the deposition species DP is continued, the deposition species DP may be deposited on a periphery region of the openings OP, whereby the openings OP may be gradually closed so that the ion storage source IP having the tip portion may be formed.

Figure 6C:
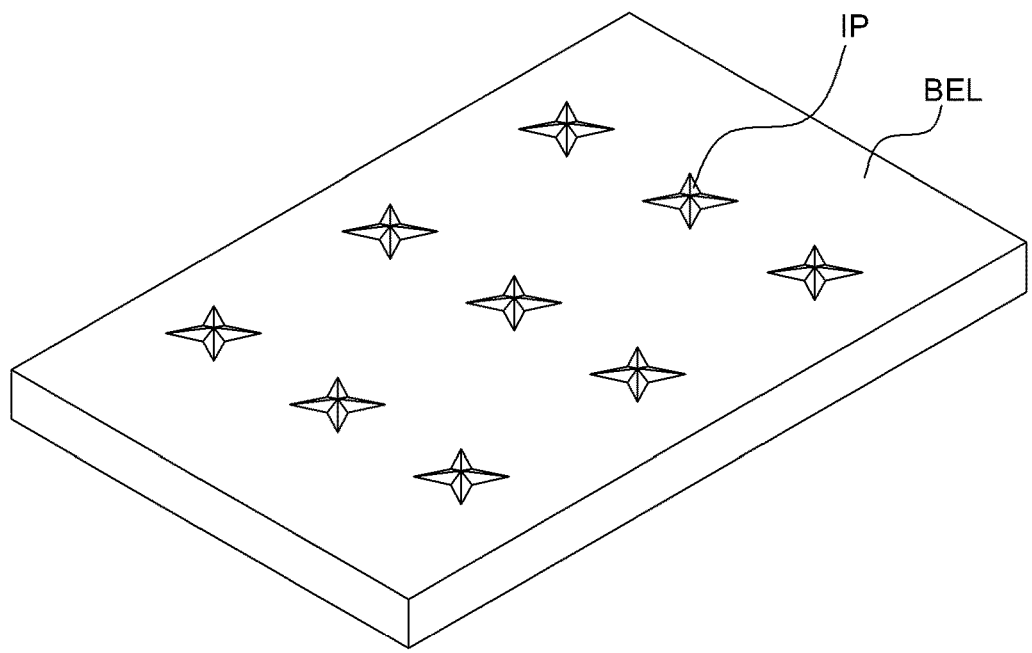

Referring to FIG. 6C, when the screen mask SM may be removed, a pyramidal ion storage source IP having the tip portion on the first conductive layer BEL may be formed. The ion storage source IP is not limited to the pyramid shape, but may have a shape such as a polygonal horn such as a cone, a cone, or a quadrilateral.

Figure 6D:
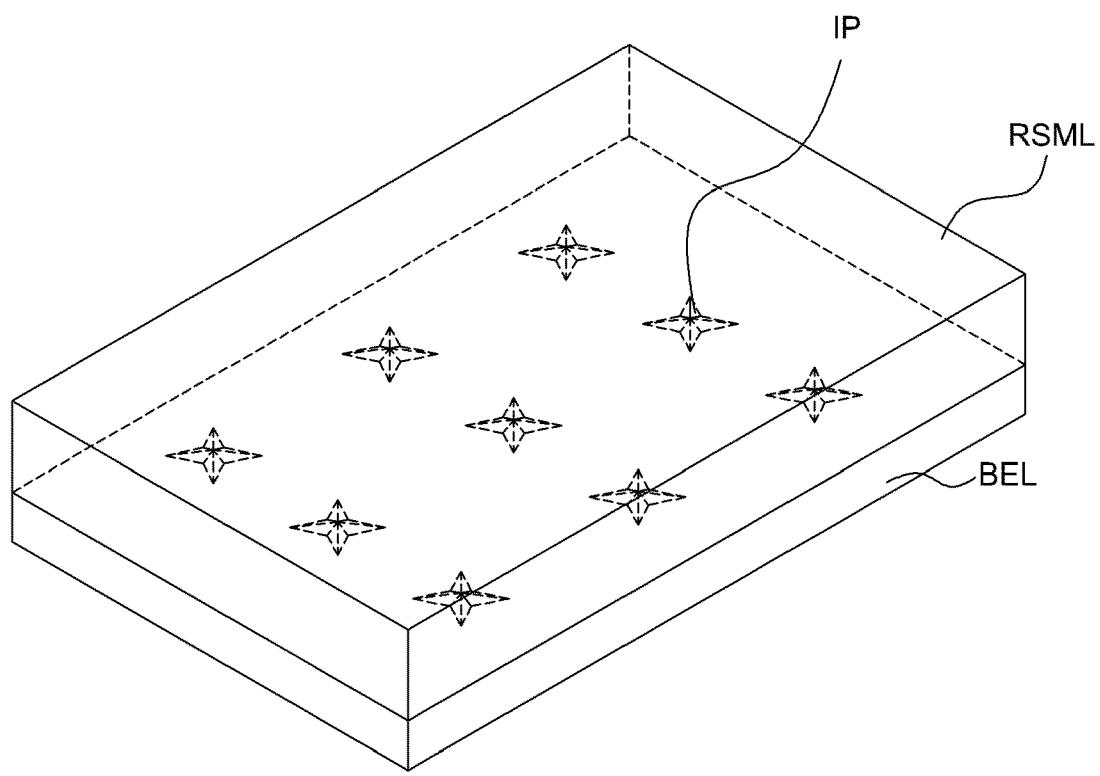
Figure 6E:
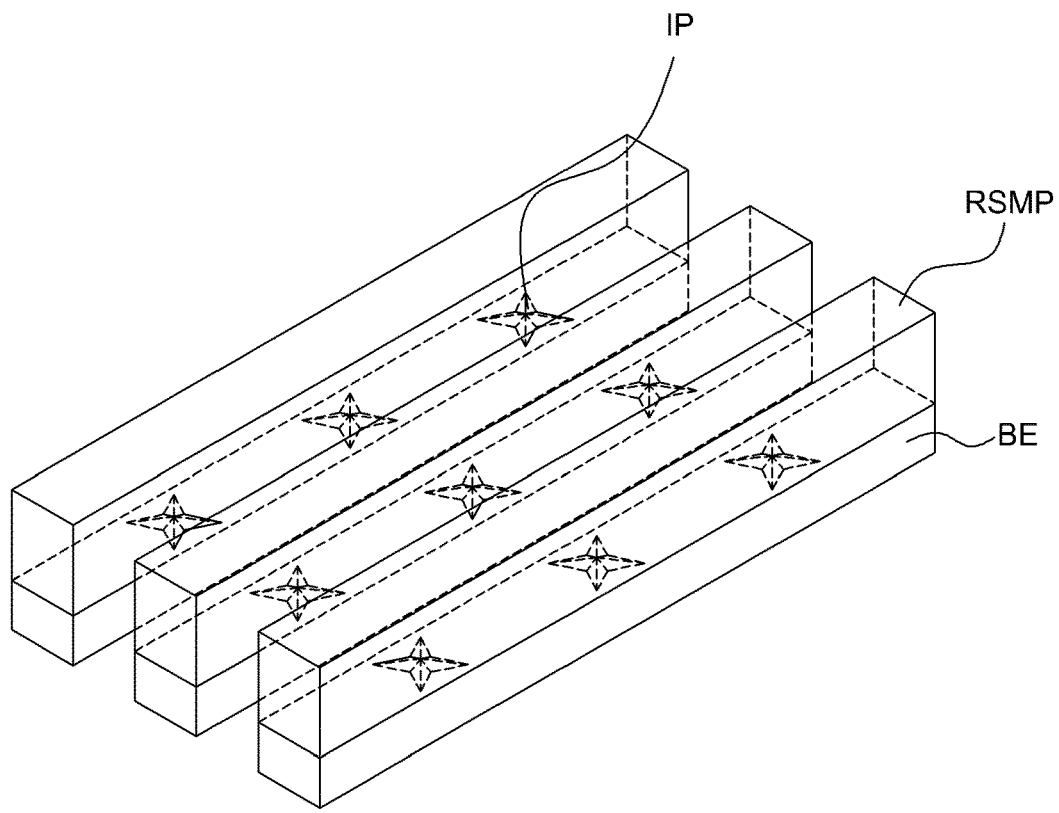

Referring to FIG. 6D, a variable insulation layer RSML to be a variable resistive layer may be formed on the resulting product in which an ion storage source IP has been already formed. Next, referring to FIG. 6e, a suitable etching mask pattern (not shown) may be formed on the variable insulation layer RSML and then, the variable insulation layer RSML and the first conductive layer BEL may be simultaneously patterned to form a first stack structure including the variable insulation layer RSML of line type and the first electrode BE.

Figure 6F:
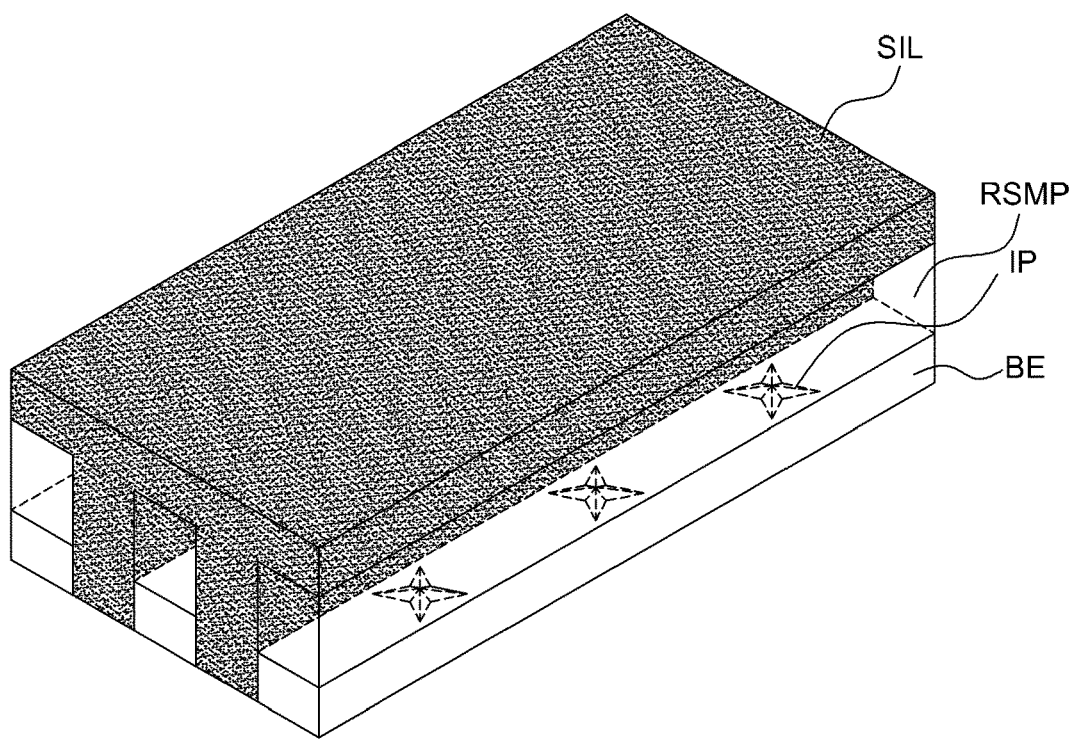
Figure 6G:
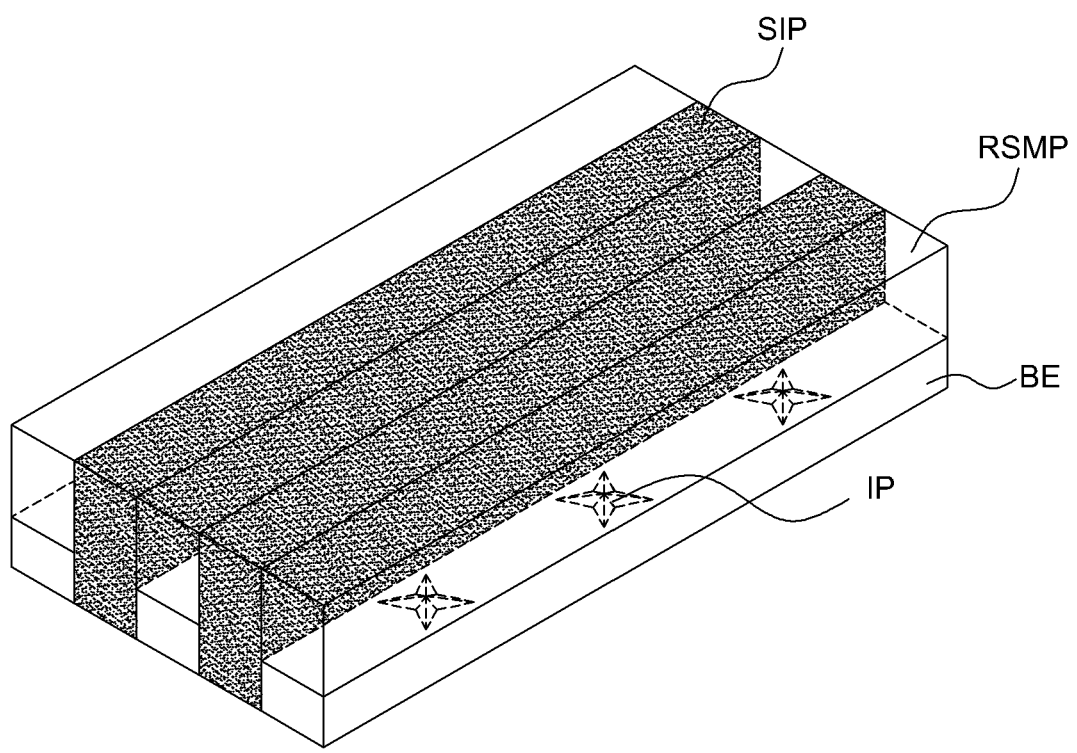

Referring to FIG. 6F, a first interlayer insulating film SIL may be formed to fill between the first stack structures having a line type. The first interlayer insulating film SIL may not have an adequate etch selectivity ratio against the variable insulation layer RSML. Referring to FIG. 6Q a portion of the first interlayer insulating film SIL may be removed until an upper surface of the line-type variable insulation film pattern RSMP lied under the first interlayer insulation film SIL may be exposed. Partial removal of the first interlayer insulating film SIL may be achieved through a chemical mechanical polishing process or an etch-back process. As a result, the first interlayer insulating film pattern SIP may be formed between the first stack structure of the line type so that the upper surface of the first interlayer insulating film pattern SIP and the first stack structure of the line type may be planarized.

Figure 6H:
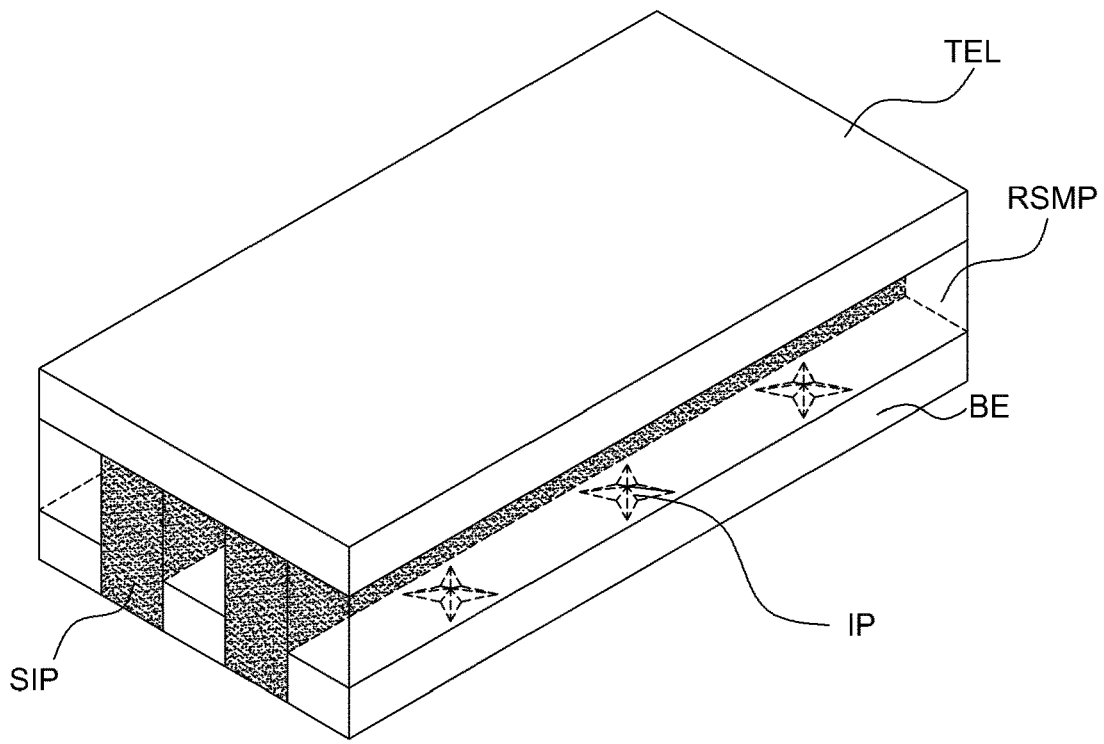
Figure 6I:
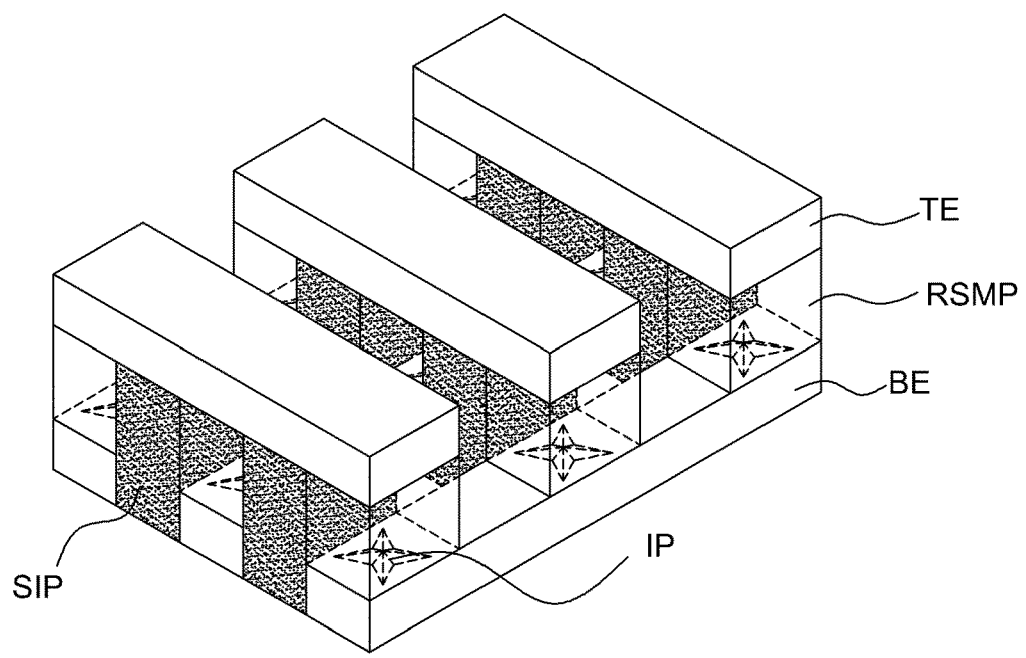

Referring to FIG. 6H, a second conductive layer TEL may be formed to form a first interlayer insulating film pattern SIP and a second electrode on the upper surface of the first stack structure. Next, as shown in FIG. 6I, a line-type etching mask pattern (not shown) crossing the first electrode BE may be formed on the second conductive layer TEL, and then a second conductive layer TEL, the lower interlayer insulating film pattern SIP and the variable insulating film pattern RSMP may be simultaneously patterned. Thereby, the second electrode TE may be formed. In addition, the variable resistive layer RSMP may be formed only in the crossing region of the first electrode BE and the second electrode TE.

Figure 6J:
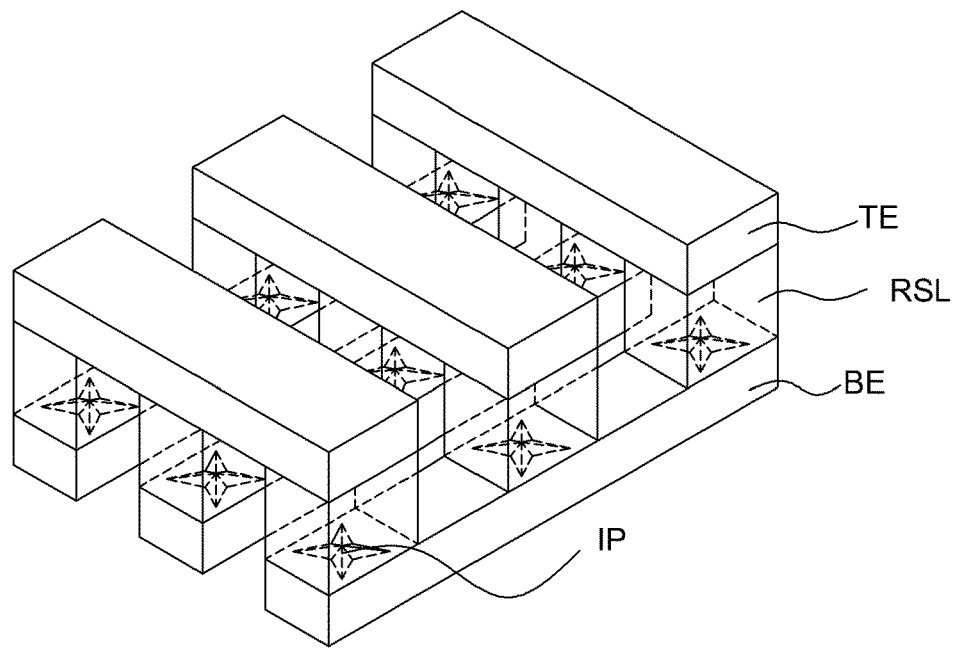

Referring to FIG. 6J, the remaining first interlayer insulating film pattern SIP may be removed. Next, a new second interlayer insulating film pattern (not shown) may be filled in an empty space between the elements to perform isolation of devices. Alternatively, the isolation of devices may be performed by additionally filling the second interlayer insulating film pattern to the space therebetween without removing the first interlayer insulating film pattern SIP.

The embodiments illustrated in FIGS. 6A to 6J relate to a method of fabricating a resistive memory element having an ion storage source IP. However, the process for using a screen mask to form an ion storage source IP having a tip portion may be used for forming a resistive memory device including an oxygen vacancy reservoir having a tip (refer to OVR of FIG. 1).

Figure 7:
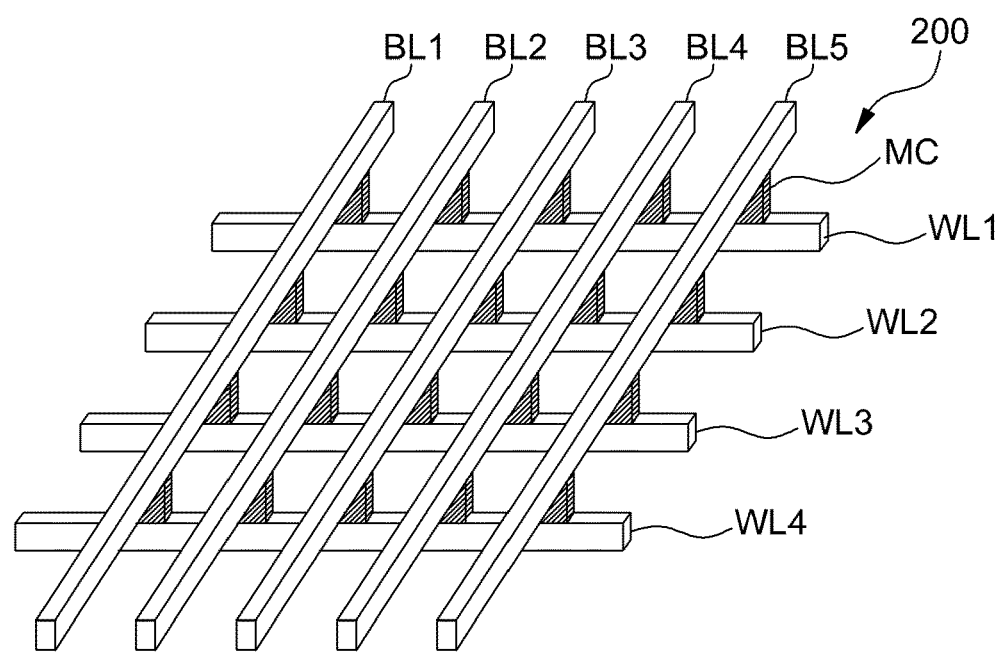
FIG. 7 is a perspective diagram showing a resistive memory device according to an embodiment of the present disclosure.

FIG. 7 is a perspective view showing a resistive memory device 200 according to an embodiment of the present disclosure.

Referring to FIG. 7, the resistive memory device 200 may include an array of memory cells MC arranged in a plurality of rows and columns. A set of wires WL1 to WL4 extend on one end of the array of memory cells MC. Similarly, another set of wires BL1 to BL5 extending in a different direction from the one set of wires WL1 to WL4 extend on the other end of the array of memory cells MC. The set of wires WL1 to WL4 may be, for example, a wordline. The other sets of wires Bl1 to BL5 may be, for example, bitlines. The first electrode BE of the memory cell described above with reference to FIG. 1 may be coupled to the bitline, and the second electrode TE may be coupled to the wordline.

In the resistive memory device 200, each memory cell MC may be disposed at each intersection of one wordline and one bitline. Read and write operations of a specific memory cell (referred to as selected memory cell) may be performed by activating a wordline and bitline associated with the selected memory cell.

The resistive memory device 200 may further include a wordline control circuit (not shown) coupled to the memory cells MC via each wordline for activating a selected wordline for reading or writing of a selected memory cell. In one embodiment, the wordline control circuit may include a multiplexer (not shown) for selecting a particular wordline among the wordlines.

The resistive memory device 200 may further include a bitline control circuit (not shown) coupled to the memory cells MC via respective bitlines BL1-BL5. In one embodiment, the bitline control circuit may include a demultiplexer, a sensing circuit, and an input/output (I/O) pad. The demultiplexer may be configured to selectively couple a bitline of a selected memory cell to the sensing circuit.

The wordline control circuit and the bitline control circuit may access the memory cells individually by activating corresponding wordlines and bitlines coupled to the selected memory cells. During the write operation, the wordline control circuit writes information to the selected memory cell by applying a predetermined voltage to the selected wordline. The demultiplexer can activate the selected memory cell, for example, by grounding the selected memory cell. In this case, a logic value is written into the selected memory cell as the current that influences the characteristics of the memory cell flows. Each memory cell can store a logical value by changing the resistance value of the variable resistive layer (RSL in FIG. 1), and can store multi-bit logical values according to the number of resistance values.

The change in the resistance value is detected through a subsequent read operation. During the read operation, the wordline control circuit applies a predetermined voltage to a selected wordline and the demultiplexer may couple the selected bitline to the sensing circuit. The logic value of the selected memory cell may be detected as the magnitude of the current detected by the sensing circuit, and the result may be transferred to the I/O pad.

The width and/or the magnitude of the voltage pulse across the memory cell for programming or reading of the selected memory cell may be adjusted. Accordingly, a particular logic state may be written or read by adjusting a resistance value of the selected memory cell. Because the read operation may be affected according to the leakage currents generated by memory cells adjacent to other selected memory cells, in one embodiment, each memory cell may include a current steering device, such as a diode or transistor serially connected to a variable resistor.

In another embodiment, the current steering characteristics provided by the current steering elements may be used to replace the current steering elements using the self-rectifying characteristics of the memory cells, thereby further simplifying the configuration and fabrication process of the resistive memory elements. The resistive memory device according to the above-described embodiments has a single-layer memory cell array, but the present disclosure is not limited thereto. For example, two or more memory cell arrays may be stacked and integrated vertically or horizontally on a substrate. In addition, although FIG. 7 exemplifies a memory cell array extended horizontally with respect to the semiconductor substrate, it may have a three-dimensional memory cell array extended in the vertical direction with respect to the semiconductor substrate.

The various resistive memory elements disclosed with reference to the accompanying drawings herein can be implemented in a single memory device, or may be implemented as a type of SOC (system on chip) together with other heterogeneous devices such as heterogeneous memory devices, a logic processor, an image sensor, and RF element in a single wafer chip. Further, the wafer chip on which the resistive memory element is formed and the other wafer chip on which the dissimilar device is formed may be formed in a single chip formed via a bonding process using an adhesive, soldering, through-silicon via (TSV), or wafer bonding technique.

Figure 8:
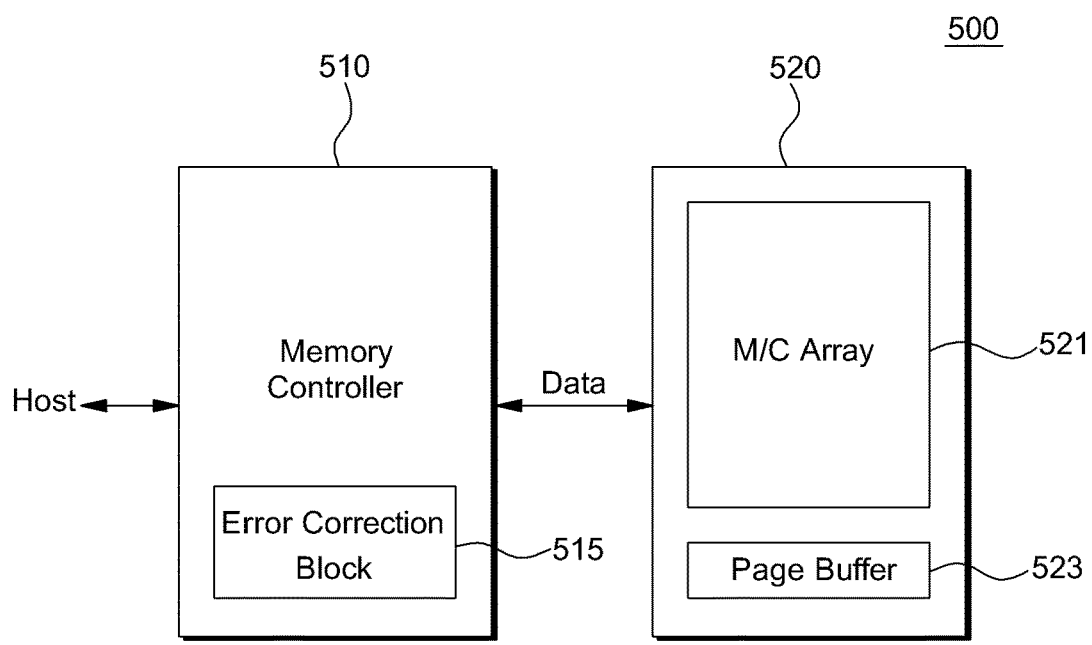
FIG. 8 is a block diagram illustrating a memory system in accordance with one embodiment of the present disclosure.

FIG. 8 is a block diagram illustrating a memory system 500 in accordance with one embodiment of the present disclosure.

Referring to FIG. 8, the memory system 500 may include a memory controller 510 and a non-volatile memory element 520. The memory controller 510 may perform an error correction code on the non-volatile memory element 520. The memory controller 510 may control the non-volatile memory element 520 with reference to an instruction and an address received from an outside circuit.

When the memory controller 510 receives a write request from a host, the memory controller 510 may perform error correction encoding on the write requested data. In addition, the memory controller 510 may control the non-volatile memory element 520 in order to program the encoded data into a memory area corresponding to the provided address. In addition, the memory controller 510 may perform error correction decoding on the data output from the nonvolatile memory 520 during a read operation. The error included in the output data may be corrected by the error correction decoding. The memory controller 510 may include an error correction block 515 to perform the detection and correction of the error.

Figure 9:
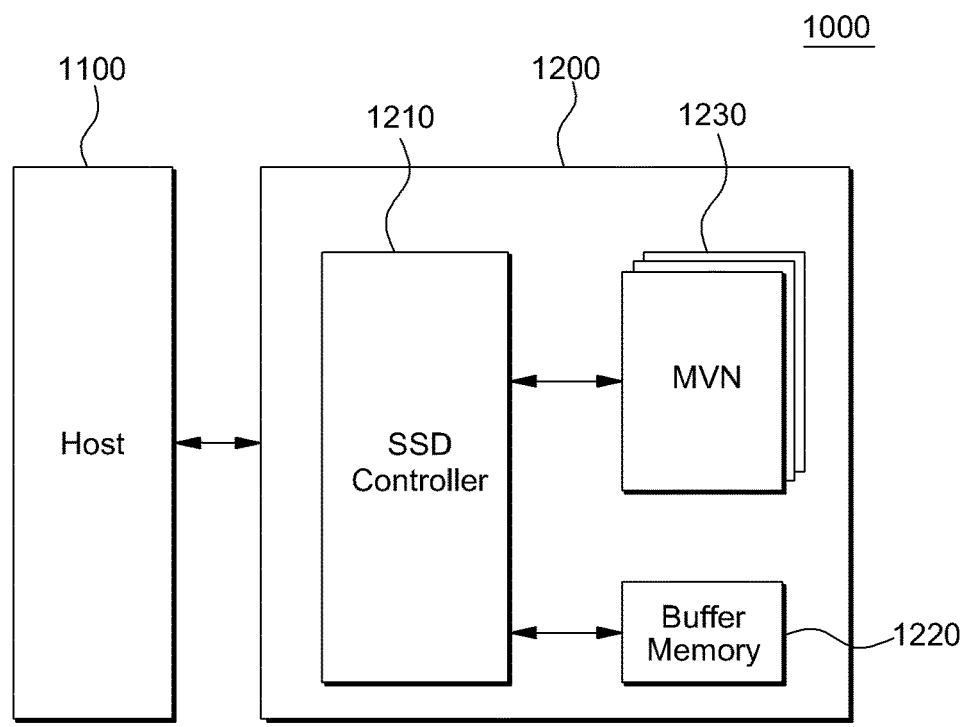
FIG. 9 is a block diagram illustrating a storage device including a solid state disk according to an embodiment of the present disclosure.

FIG. 9 is a block diagram illustrating a storage device 1000 including a solid state disk SSD according to an embodiment of the present disclosure.

Referring to FIG. 9, a storage device 1000 may include a host 1100 and an SSD 1200. The SSD 1200 may include an SSD controller 1210, a buffer memory 1220, and a non-volatile memory element 1230. The SSD controller 1210 provides electrical and physical connections between the host 1100 and the SSD 1200. In one embodiment, the SSD controller 1210 provides interfacing with the SSD 1200 in response to the bus format of the host 1100. In addition, the SSD controller 1210 can access the non-volatile memory element 1230 according to the decoded result of decoding the instruction provided from the host 1100. The examples of the bus format of the host 1100 may include a USB (Universal Serial Bus), a SCSI (Small Computer System Interface), a PCI express, an Advanced Technology Attachment (ATA), a Parallel ATA (PATA), a SATA (Serial ATA), and Serial Attached SCSI (SAS).

Write data provided from the host 1100 or data read from the nonvolatile memory element 1230 may be temporarily stored in the buffer memory 1220. When the data existing in the nonvolatile memory element 1230 is cached at the time of the read request of the host 1100, the buffer memory 1220 is provided with a cache function to directly provide the cached data to the host 1100. In general, the data transfer rate by the host 1100 bus format (e.g., SATA or SAS) may be faster than the transfer rate of the memory channel of the SSD 1200. In this case, a large-capacity buffer memory 1220 is provided to minimize the performance degradation caused by the speed difference. For this purpose, the buffer memory 1220 may be a synchronous DRAM to provide sufficient buffering, but it is not limited to thereto.

The nonvolatile memory element 1230 may be provided as a storage medium of the SSD 1200. For example, the non-volatile memory element 1230 may be a resistive memory element having a large storage capacity according to the above-described embodiment. In another example, a memory system in which a NOR flash memory, a phase change memory, a magnetic memory, a ferroelectric memory, or a heterogeneous memory device selected from these are mixed is also applicable as the nonvolatile memory element 1230.

Figure 10:
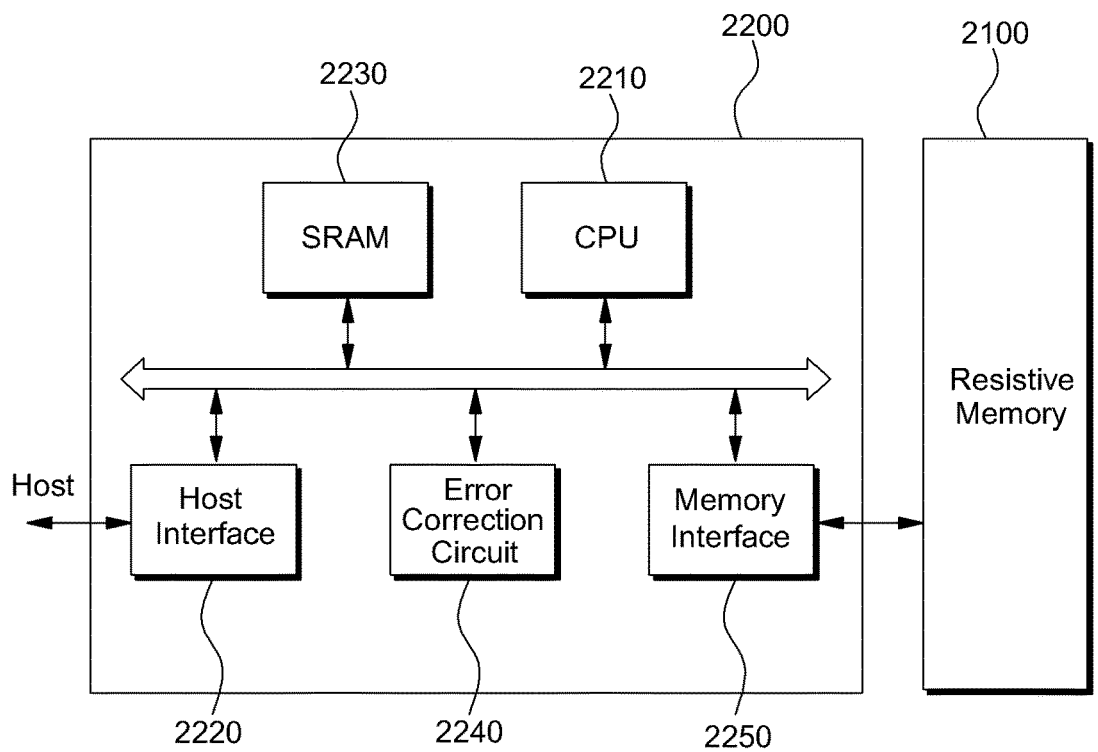
FIG. 10 is a block diagram illustrating a memory system in accordance with another embodiment of the present disclosure.

FIG. 10 is a block diagram illustrating a memory system 2000 in accordance with another embodiment of the present disclosure.

Referring to FIG. 10, a memory system 2000 according to the present disclosure may include a memory controller 2200 and a resistive memory element 2100. The memory controller 2200 may be configured to control the resistive memory element 2100. The SRAM 2230 can be used as an operation memory of the CPU 2210. The host interface 2220 may implement the data exchange protocol of the host connected to the memory system 2000. The error correction circuit 2240 provided in the memory controller 2200 can detect and correct errors contained in data read from the resistive memory element 2100. The memory interface 2260 may interface with the resistive memory element 2100 of the present disclosure. The CPU 2210 can perform all control operations for data exchange of the memory controller 2200. The memory system 2000 according to the present disclosure may further include a ROM (not shown) for storing code data for interfacing with a host.

The memory controller 2100 is configured to communicate with external circuitry (for example, a host) through any of a variety of interface protocols such as USB, MMC, PCI-E, SAS, SATA, PATA, SCSI, and ESDI or IDE. The memory system 2000 according to the present disclosure may be applied to various kinds of user devices such as a computer, a portable computer, an UMPC (Ultra Mobile PC), a workstation, a netbook, a PDA, a portable computer, a web tablet, Such as a wireless phone, a mobile phone, a smart phone, a digital camera, a digital audio recorder, a digital audio player, a digital picture recorder, A digital picture player, a digital video player, a digital video player, a device capable of transmitting and receiving information in a wireless environment, and a home network.

Figure 11:
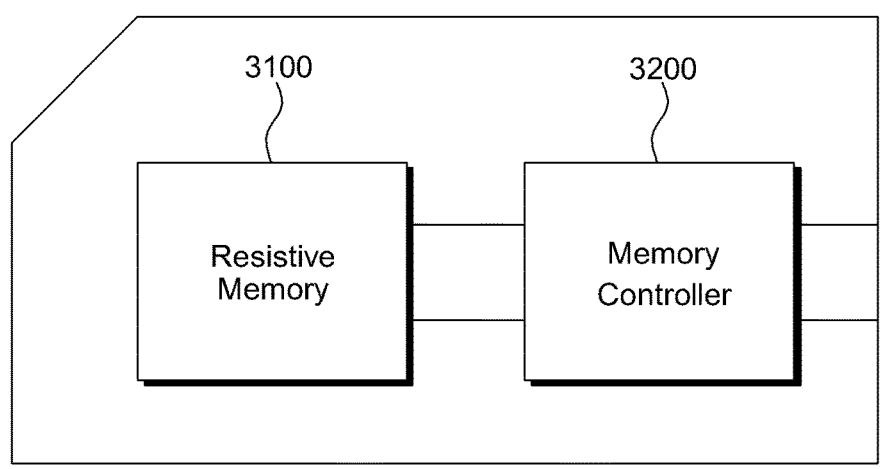
FIG. 11 is a block diagram illustrating a data storage device according to another embodiment of the present disclosure.

FIG. 11 is a block diagram illustrating a data storage device 3000 according to another embodiment of the present disclosure.

Referring to FIG. 11, a data storage device 3000 according to the present disclosure may include a resistive memory 3100 and a memory controller 3200. The memory controller 3200 may control the resistive memory 3100 based on control signals received from external circuitry of the data storage device 3000. The three-dimensional memory array structure of the resistive memory 3100 may have, for example, a cross-point structure, but the present disclosure is not limited thereto.

The data storage device 3000 of the present disclosure can constitute a memory card device, an SSD device, a multi-media card device, an SD card, a memory stick device, a hard disk drive device, a hybrid drive device, or a universal serial bus flash device. For example, the data storage device 3000 of the present disclosure may be a memory card that meets standards or specifications for using electronic devices such as digital, camera, or personal computers.

Figure 12:
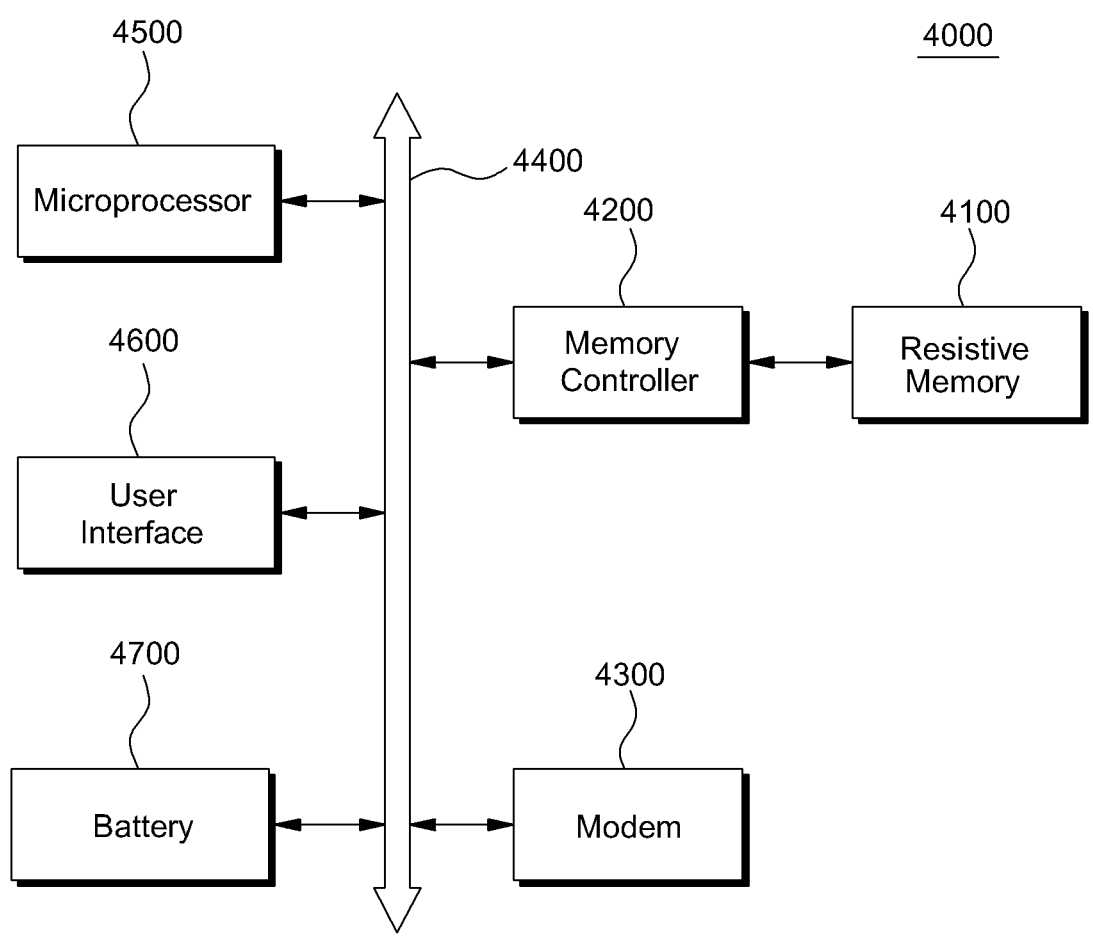
FIG. 12 is a block diagram illustrating a resistive memory device and a computing system including the same, according to an embodiment of the present disclosure.

FIG. 12 is a block diagram illustrating a resistive memory device 4100 and a computing system 4000 including the same according to one embodiment of the present disclosure.

Referring to FIG. 12, a computing system 4000 in accordance with the present disclosure may include a resistive memory device 4100 electrically coupled to a bus 4400, a memory controller 4200, a modem 4300 such as a baseband chipset, a microprocessor 4500, and a user interface 4600.

The resistive memory element 4100 shown in FIG. 12 may be the above-described nonvolatile memory element. The computing system 4000 according to the present disclosure may be a mobile device, and in this case, a battery 4700 may be further provided for supplying the operating voltage of the computing system 4000. Although not shown, an application chipset, a camera image processor (CIS), or a mobile DRAM may be further provided in the computing system according to the present disclosure. The memory controller 4200 and the flash memory device 4100 can constitute, for example, a solid state drive/disk (SSD) using a nonvolatile memory element for storing data.

The nonvolatile memory device and/or memory controller according to the present disclosure can be implemented using various types of packages. For example, the flash memory device and/or the memory controller according to the present disclosure may be implemented using the packages such as Package on Package (PoP), Ball grid arrays (BGAs), Chip scale packages (CSPs), Plastic Leaded Chip Carriers (PLCC) Linear Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack Outline (SOIC), Shrink Small Outline Package (SSOP), Thin Small Outline (TSOP), System In Package (SIP), Multi Chip Package (MCP), or Wafer-level Fabricated Package (WSP).

The present disclosure which is explained in the previous paragraphs is not limited to the foregoing embodiments and the drawings, and it will be apparent to those skilled in the art that various modifications and variations can be made in the present disclosure without departing from the spirit or scope of the invention.

What is claimed is:

1. A resistive memory device comprising:
a first electrode electrically coupled with a first wire;
a second electrode facing the first electrode and electrically coupled with a second wire, the second electrode including a finite oxygen vacancy reservoir and a contact electrode; and
a memory cell including a variable resistive layer and being disposed between the first electrode and the second electrode, the variable resistive layer having a conductive filament that includes one or more oxygen vacancies and that connects the first electrode and the second electrode,
wherein the finite oxygen vacancy reservoir is disposed on the variable resistive layer, and the contact electrode is coupled to the finite oxygen vacancy reservoir and the second wire, and
wherein the finite oxygen vacancy reservoir has a volume or oxidizing power to exchange a limited amount of oxygen ions and oxygen vacancies required for switching the conductive filament with the variable resistive layer.

2. The resistive memory device according to claim 1, wherein the variable resistive layer comprises a metal oxide having a stoichiometric composition or an oxygen-deficient composition.

3. The resistive memory device according to claim 1, wherein the metal oxide includes at least one selected from the group consisting of tantalum (Ta), scandium (Sc), yttrium (Y), titanium (Ti), zirconium (Zr), vanadium (V), chromium (Cr), niobium (Nb), osmium (Os), manganese (Mn), iron (Fe), nickel (Ni), copper (Cu), silver (Ag), zinc (Zn), hafnium (Hf), and tungsten (W).

4. The resistive memory device according to claim 1, wherein the variable resistive layer comprises a metal oxide, and the finite oxygen vacancy reservoir has a lower oxidation potential energy than the metal oxide of the variable resistive layer.

5. The resistive memory device according to claim 1, wherein the first electrode comprises a non-reactive metal having a lower oxidizing power than a material in the finite oxygen vacancy reservoir.

6. The resistive memory device according to claim 1, wherein the finite oxygen vacancy reservoir includes a metal or an oxide of the metal, the metal including one or more of tantalum (Ta), titanium (Ti), zirconium (Zr), vanadium (V), tungsten (W), and ruthenium (Ru).

7. The resistive memory device according to claim 1, wherein the volume of the finite oxygen vacancy reservoir is based on at least one of the number of the one or more oxygen vacancies in the conductive filament, a diameter of the conductive filament, and an oxygen solubility of the finite oxygen vacancy reservoir.

8. The resistive memory device according to claim 1, wherein the finite oxygen vacancy reservoir is locally disposed on a partial region of the variable resistive.

9. The resistive memory device according to claim 1, wherein a thickness of the finite oxygen vacancy reservoir is within a range of 3 to 20 times of a thickness of the variable resistive layer.

* * * * *